United States Patent [19]

Ridgeway

[11] Patent Number: 5,329,181
[45] Date of Patent: Jul. 12, 1994

[54] COMPLEMENTARY MACROCELL FEEDBACK CIRCUIT

[75] Inventor: David J. Ridgeway, San Jose, Calif.

[73] Assignee: Xilinx, Inc., San Jose, Calif.

[21] Appl. No.: 27,211

[22] Filed: Mar. 5, 1993

[51] Int. Cl.[5] .......................................... H03K 19/177
[52] U.S. Cl. ...................................... 307/465; 307/243
[58] Field of Search ................... 307/443, 465, 465.1, 307/243

[56] References Cited

U.S. PATENT DOCUMENTS

| 4,857,773 | 8/1989 | Takata et al. | 307/465 |
| 4,903,223 | 2/1990 | Norman et al. | 307/465 X |
| 4,987,319 | 1/1991 | Kawana | 307/243 X |

Primary Examiner—David R. Hudspeth
Attorney, Agent, or Firm—Edel M. Young

[57] ABSTRACT

In a programmable logic device having I/O blocks and logic blocks, two lines leading from a region including a logic block and an I/O block alternately provide a logic block output signal and its complement or a logic block output signal and an I/O block input signal. A multiplexer selects between providing on a line leading from an I/O block to an interconnect structure a first signal which is provided by the I/O block when the I/O block is an input buffer and a second signal which is the inverse of a logic signal provided to the I/O block when the I/O block is not an input buffer. Thus in one case two lines which extend from the I/O block to the interconnect structure may carry
  a) a logic block output signal and
  b) an I/O block output signal;
and in the other case carry
  a) a logic block output signal and
  b) the inverse of the logic block output signal.

4 Claims, 2 Drawing Sheets

COMPLEMENTARY MACROCELL FEEDBACK CIRCUIT

FIELD OF THE INVENTION

The invention relates to programmable integrated circuit structures, particularly to circuits for interconnecting logic blocks and input/output buffers to an interconnect structure.

BACKGROUND OF THE INVENTION

FIG. 1 shows a circuit used in a prior art logic device such as manufactured by Xilinx, Inc, assignee of the present invention. I/O block 15 is a programmable input/output block which is connected through line 17 to an external pin of the integrated circuit chip, and which may be configured as an input buffer or an output buffer. Logic block 13 receives input signals on lines such as line 12, and generates an output signal on line 14. When I/O block 15 is configured as an output buffer, this output signal from line 14 is applied by I/O block 15 to an external pin. When I/O block 15 is configured as an input buffer, line 16 carries a signal from the pin to a universal interconnect matrix (UIM) 11. Alternatively, or in addition, the signal on line 14 may be fed back to UIM 11. Thus two lines, line 14 and line 16 are provided to connect the output of logic block 13 and the input and output of I/O block 15 to UIM 11. In a typical device, many pairs of logic block and I/O block will connect into the same UIM 11. For simplicity, only one additional pair of lines $\overline{33}$ and $\overline{37}$ is shown in FIG. 1.

At intersections of UIM 11 are programmable interconnectors such as interconnector 18. FIG. 2 shows the structure of interconnector 18. If EPROM transistor 19 has been programmed to form a connection, a high signal on line $\overline{14}$ may turn on EPROM transistor 19 so that voltage on line 12c is pulled low. A pullup resistor 20 connects line 12c to VCC so that if no lines such as lines $\overline{14}$ and $\overline{16}$ pull down line 12c, line 12c is pulled high. Thus line 12c provides the AND function of lines 14 and 16 and other lines which connect to line 12c. Each intersection in UIM 11 comprises a circuit such as circuit 18 shown in FIG. 2. In embodiments having many lines such as $\overline{14}$ and $\overline{16}$ entering UIM 11, very wide AND functions can be generated.

It is desirable to be able to generate additional functions such as NAND, NOR, and OR using UIM 11.

Further, with design rules becoming smaller and integrated circuit devices becoming more highly integrated, lines such as lines 14 and 16 can occupy considerable area in the chip. Thus it is desirable to minimize the number of lines needed to provide the necessary interconnections, and to maximize the usefulness of each line.

SUMMARY OF THE INVENTION

In accordance with the present invention, means are provided to select alternative functions on a line leading from an I/O block to a UIM. A multiplexer selects between providing a first signal which comes from the I/O block when the I/O block is an input buffer and a second signal which is the inverse of a logic signal output from a logic block when the I/O block is not an input buffer. Thus two lines which extend from the I/O block to UIM may in one case carry
 a) a logic block output signal and
 b) an I/O block output signal;
and in the other case carry
 a) a logic block output signal and
 b) the inverse of the logic block output signal.

This means that the number of functions available as input to a UIM is increased without an increase in the number of lines leading to the UIM. Importantly, the inverse of the logic block output signal is provided to the UIM so that logic functions such as AND, NAND, OR, and NOR can all be generated using the same UIM with pullup resistors. (Of course pull-down resistors or a combination of pull-up and pull-down resistors may alternatively be used.)

In another embodiment, two lines which extend from the I/O block to the UIM may in a first case provide
 a) an I/O block output signal and
 b) the complement of the I/O block output signal;
in a second case provide
 a) a logic block output signal and
 b) the complement of the logic block output signal
in a third case provide
 a) a logic block output signal and
 b) an I/O block output signal;
and in a fourth case provide
 a) the complement of the I/O block output signal and
 b) the complement of the logic block output signal.
Thus the number of functions available to the UIM is even further increased.

DETAILED DESCRIPTION OF A PREFERRED EMBODIMENT

Figure 3:
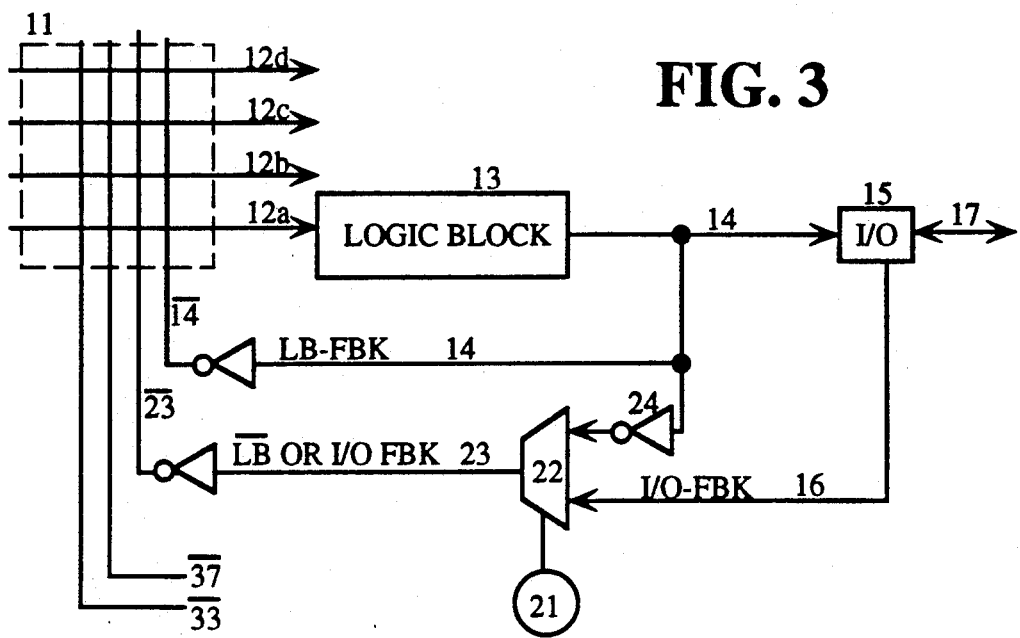
FIG. 3 shows a circuit of the present invention for connecting a logic block and an I/O block to an interconnect matrix.

As shown in FIG. 3, the circuitry needed to achieve the greater flexibility of the present invention comprises, in one embodiment, a multiplexer, an inverter, and a signal for controlling the multiplexer. This combined circuitry and wiring will allow some designs to be implemented in less chip area than the prior art circuitry because in many instances an inverter must be provided in order to allow the user the necessary inversion to implement a desired logic function. An extra function is added without adding an extra line to carry the inverted signal. Thus total area in the metal layers of the chip is not increased.

Figure 1:
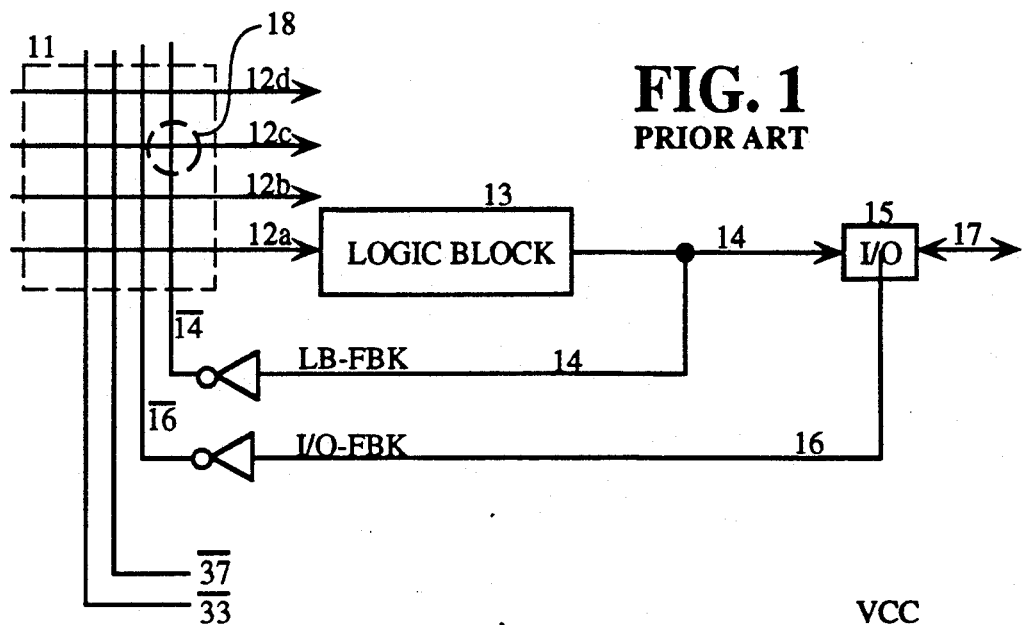
FIG. 1 shows a prior art circuit for connecting a logic block and an I/O block to an interconnect matrix (UIM).
Figure 2:
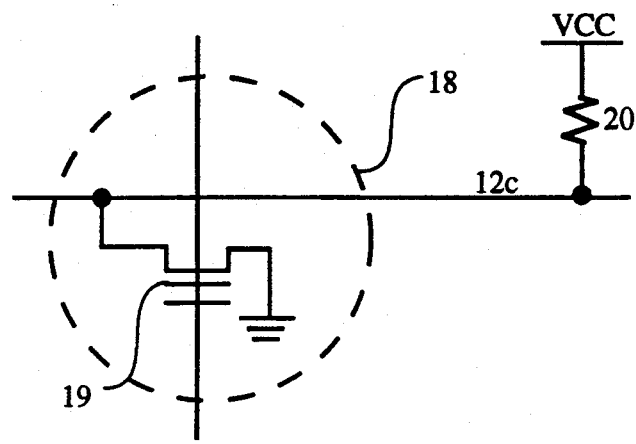
FIG. 2 shows an interconnect element used in the UIM of FIG. 1.

The circuit of FIG. 3 includes certain elements also present in FIG. 1. These are given the same reference numerals in both figures and are not explained again here. Also present in FIG. 3 are inverter 24, multiplexer 22, and programmable select bit 21. Line 23 carries a selected signal, either the complement of the signal on line 14 or the buffer input signal on line 16, as selected by programmable select bit 21.

When I/O block 15 is operating in its output buffer mode, line 16 is not needed, and lines 14 and 23 can carry both the logic block 13 output and its complement to UIM 11. True and complement signals can also be provided when I/O block 15 is not used. When I/O block 15 is operating in its input buffer mode, select bit 21 is set to connect the input buffer signal on line 16 to line 23. Only in this case is the complement of the signal on line 14 not available on line 23. For many designs, the logic may be placed so that I/O buffers which are configured as output buffers will be physically combined with logic blocks for which both true and complement output signals are required. Thus no increased in interconnect density is required, and both true and complement of the logic block output signals are provided.

Figure 4:
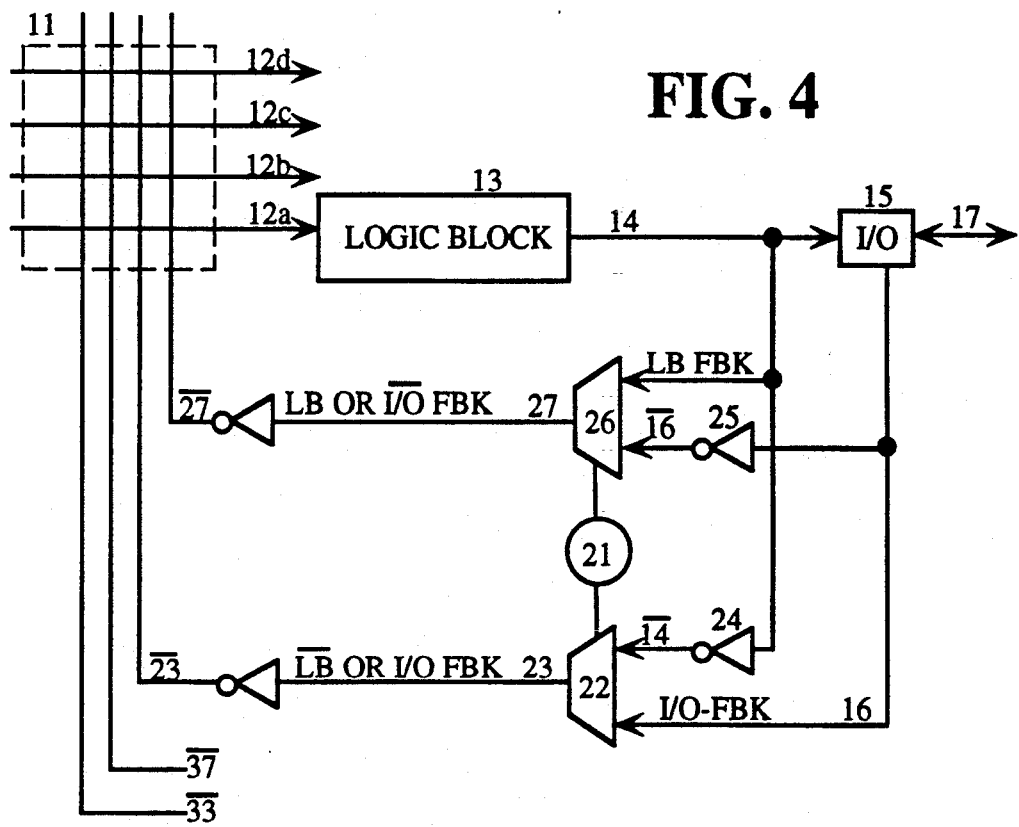
FIGS. 4 and 5 show alternative embodiments of the circuit of the present invention.

FIG. 4 shows an alternative embodiment in which two modes are available and are selected by select bit 21. In a first mode select bit 21 causes multiplexers 26 and 22 to provide on lines 27 and 23 respectively the logic block output of line 14 and its complement provided on line $\overline{14}$. In a second mode, select bit 21 causes multiplexers 26 and 22 to provide on lines 23 and 27 respectively the I/O block output on line 16 and its complement on line $\overline{16}$.

Figure 5:
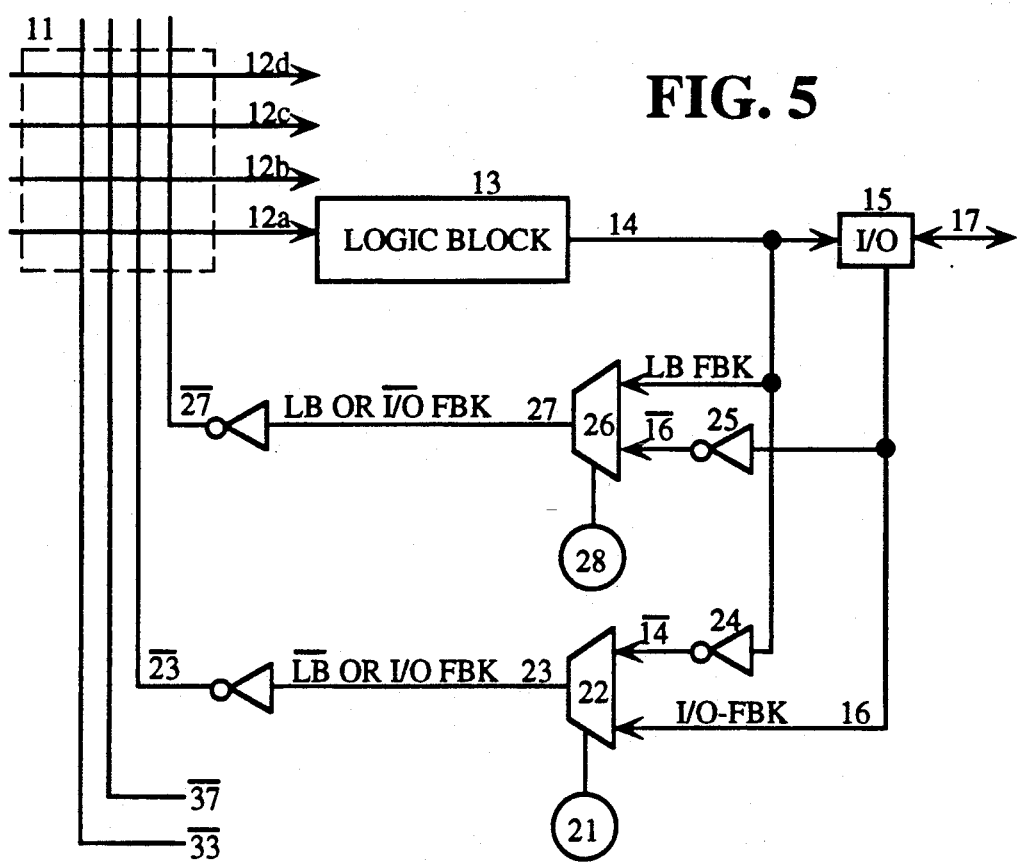

FIG. 5 shows an embodiment having maximum flexibility in which two select bits offer four options for signals provided on lines 23 and 27. By separately selecting the states of multiplexers 22 and 26, the circuit can provide on line 23 either the $\overline{LB}$ output or the output of I/O block 15. And the circuit can provide on line 27 either the LB output or the complement of the output of I/O block 15.

In light of the above description, other embodiments of the invention will become obvious to those skilled in the art, and are intended to fall within the scope of the present invention.

I claim:

1. A feedback circuit comprising:
    a first line (14) for providing a logic block output signal;
    a second line (16) for providing a second signal;
    means (24) for generating the complement of said logic block output signal;
    a third line (23); and
    means (22) for providing on said third line a selected one of said complement of said logic block output signal and said second signal;
    an interconnect structure (11); and
    means (19) for programmably connecting said first line and said third line to said interconnect structure.

2. A feedback circuit as in claim 1 in which said means for programmably connecting said first line and said third line to said interconnect structure comprise for each connection a transistor (19) having at gate controlled by said first or third line ($\overline{14}$), a source for providing a supply voltage (ground), and a drain connected to another line (12c) in said interconnect structure.

3. A feedback circuit comprising:
    a first line (14) for providing a logic block output signal;
    a second line (16) for providing a second signal;
    means (24) for generating the complement of said logic block output signal;
    a third line (23); and
    means (22) for providing on said third line a selected one of said complement of said logic block output signal and said second signal;
    in which said means for generating the complement of said logic block output signal comprises an inverter (24).

4. A feedback circuit comprising:
    a logic block (13) for generating a logic block output signal (14);
    an I/O block (15) for alternatively providing on an external line (17) said logic block output signal and providing on an internal line (16) a signal received from said external line;
    a first line (23) for providing a first signal;
    a second line (27) for providing a second signal; and
    means for providing on said first and second lines a selected one of each of the following pairs of signals:
    1) an I/O block output signal and the complement of the I/O block output signal;
    2) a logic block output signal and the complement of the logic block output signal;
    3) a logic block output signal and an I/O block output signal; and
    4) the complement of the I/O block output signal and the complement of the logic block output signal.

* * * * *